United States Patent [19]

Gay et al.

[11] Patent Number: 4,571,558
[45] Date of Patent: Feb. 18, 1986

[54] VOLTAGE CONTROLLED CRYSTAL OSCILLATOR WITH REDUCED OSCILLATIONS AT CRYSTAL OVERTONES

[75] Inventors: Michael J. Gay; Johannes Gutmann, both of Vaud, Switzerland

[73] Assignee: Motorola, Inc., Schaumburg, Ill.

[21] Appl. No.: 665,806

[22] Filed: Oct. 29, 1984

[30] Foreign Application Priority Data

Nov. 1, 1983 [GB] United Kingdom ............... 8329131

[51] Int. Cl.$^4$ ................. H03B 1/04; H03B 5/36
[52] U.S. Cl. ..................... 331/105; 331/116 R; 331/158; 331/177 R
[58] Field of Search ............. 331/105, 116 R, 116 FE, 331/158, 159, 177 R

[56] References Cited

U.S. PATENT DOCUMENTS 3,676,801  7/1972  Musa ........................... 331/116 FE
3,973,221  8/1976  Jett, Jr. ....................... 331/177 R X Primary Examiner—Eugene R. LaRoche
Assistant Examiner—D. C. Mis
Attorney, Agent, or Firm—Vincent B. Ingrassia

[57] ABSTRACT

The invention relates to a crystal controllable oscillator circuit. The oscillator includes an amplifier and an oscillation sustaining feed-back loop coupled between an output and an input of the amplifier the loop including two integrators in series for inhibiting oscillation at crystal overtones. Each integrator provides 90° phase shift independently of the oscillators defining RC product which determines only the gain thereby making the oscillator less sensitive to variations in circuit time constants due to temperature and manufacturing tolerance effects. The invention is particularly suitable for incorporating in integrated circuit form where only a single pin connection is required for the controlling crystal.

11 Claims, 3 Drawing Figures

VOLTAGE CONTROLLED CRYSTAL OSCILLATOR WITH REDUCED OSCILLATIONS AT CRYSTAL OVERTONES

TECHNICAL FIELD

This invention relates to an oscillator circuit and is particulary applicable to a crystal controllable oscillator.

BACKGROUND ART

A problem with known crystal controllable oscillator circuits is that of oscillating at overtone frequencies of the controlling crystal.

It is known that oscillation at overtone frequencies may be inhibited by the use of circuits having sensibly lower gain and/or sensibly less favourable phase shifts at the overtone frequency than at the fundamental.

In integrated circuit technology such circuits have been achieved by the use of resistor-capacitor time constants to provide the desired response.

Variations in these time constants due to temperature and manufacturing tolerance effects may cause variations in loop phase shift of the oscillator and consequently variations in frequency.

BRIEF SUMMARY OF THE INVENTION

According to the present invention there is provided a crystal controllable oscillator circuit comprising an amplifier, an oscillation sustaining feedback loop coupled between an output and an input of the amplifier, the loop including a first integrator and a second integrator fed from the first integrator whereby overtone oscillations are inhibited.

Each of the two integrators provides 90° phase shift independently of the oscillators defining RC product, which determines only the gain, thereby making the oscillator less sensitive to variations in time constants due to temperature and manufacturing tolerance effects.

The amplifier may conveniently comprise a differential amplifier having an output and first and second inputs, the feedback loop being coupled to the output of the differential amplifier, and means being provided for coupling the output of the second integrator to the first and second inputs of the differential amplifier.

The output of the second integrator may be coupled to a first of two terminals of resistive means the said two terminals being coupled to respective ones of the first and second inputs of the differential amplifier.

The first integrator may comprise capacitive means coupled between the output of the differential amplifier and a supply terminal.

The second integrator may comprise a first transistor having an input terminal and an output terminal; resistive means coupled between the input terminal of the first transistor and the first integrator, a second transistor having an input terminal coupled to the output terminal of the first transistor and having an output terminal, and capacitive means coupled between the input terminal of the first transistor and the output terminal of the second transistor.

The second transistor is conveniently connected as an emitter follower.

The oscillator may be provided with means for adjusting the frequency of oscillation.

The means for adjusting the frequency of oscillation of the oscillator may comprise a control circuit having an input coupled to the output of the second of the two integrators and an output coupled to an input of the second integrator whereby the loop phase shift of the feedback loop may be controlled in dependence upon the amplitude of a control signal applied to the said input by the control circuit.

The control circuit may be arranged to provide a control signal whose amplitude range provides loop phase shifts of opposite sense about zero phase shift.

The control circuit may comprise differential amplifier means having an input fed from the output of the second integrator and an output for providing the control signal; and tail current adjustment means for enabling a tail current of the differential amplifier means to be changed to effect adjustment of the amplitude of the control signal.

The differential amplifier means may include two differential amplifiers having outputs coupled together to provide the output of the circuit and each having an input coupled to the output of the second integrator, the tail current adjustment means being arranged to provide relative adjustment of the tail currents of the two differential amplifiers.

In a preferred embodiment of the invention the amplifier is coupled to an auxiliary negative feedback loop having relatively low gain at oscillator signal frequencies for providing quiescent D.C. biasing for the amplifier.

BRIEF DESCRIPTION OF THE DRAWINGS

An exemplary embodiment of the invention will now be described with reference to the drawings in which.

DETAILED DESCRIPTION OF INVENTION

Figure 1:
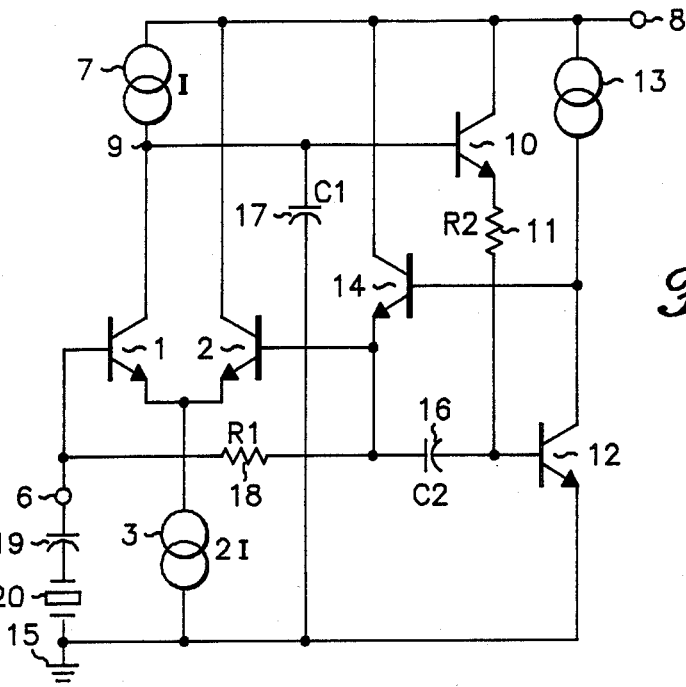
FIG. 1 shows a simplified schematic illustration of an oscillator circuit in accordance with the present invention.

Refering to FIG. 1 the oscillator illustrated includes an amplifier in the form of a differential amplifier having NPN transistors 1 and 2 whose emitter electrodes are coupled together and to a current source 3 which passes a current 2I. The transistor 1 has a base electrode which is coupled to an input terminal 6 of the amplifier.

The collector electrode of the transistor 1 is fed from a current source 7 which supplies a current I. Collector electrode of the transistor 2 is coupled to a potential supply terminal 8 which as illustrated is a positive supply terminal. An output of the amplifier is taken from a terminal 9 which is coupled to the collector electrode of the transistor 1 and the output terminal 9 of the amplifier is coupled back to the input terminal 6 to provide an oscillation sustaining feed-back loop in the manner now to be described.

The output terminal 9 of the amplifier is coupled to the base electrode of an NPN transistor 10 which is connected as an emitter follower. The transistor 10 has a collector electrode coupled to the supply terminal 8 and an emitter electrode which is coupled through a resistor 11 of value $R_2$ to the base electrode of an NPN transistor 12.

The transistor 12 has a collector electrode which is fed from a current source 13 and coupled to the base electrode of a further NPN transistor 14. The emitter electrode of the transistor 12 is connected to a second supply terminal 15 which is typically an earth terminal.

The collector electrode of the transistor 14 is coupled to the positive supply terminal 8 whilst the emitter electrode is coupled to the base electrode of transistor 2 of the differential amplifier and to one terminal of a capacitor 16 of capacitance value $C_2$. The second terminal of the capacitor 16 is connected to the base electrode of the transistor 12. A further capacitor 17 of value $C_1$ is coupled between the output terminal 9 of the differential amplifier and the earth terminal 15.

The emitter electrode of the transistor 14 is also coupled to one terminal of a resistor 18 of value $R_1$ whose second terminal is coupled to the input terminal 6 of the differential amplifier.

Also coupled to the input terminal 6 is a crystal branch comprising a capacitor 19 and a piezo electrode crystal 20 connected in series between the terminal 6 and the earth terminal 15.

The oscillation sustaining feed-back loop coupled between the output terminal 9 and the input terminal 6 of the differential amplifier formed by the transistors 1 and 2 includes two series connected integrators. The first of the integrators is formed by the capacitor 17 whilst the second integrator is formed by the resistor 11 the transistors 12 and 14 and the capacitor 16.

In operation output current supplied by the transistor 1 is integrated by the capacitor 17. The voltage developed across the capacitor 17 is applied via the emitter follower formed by the transistor 10 to the second integrator.

Output voltage provided by the second integrator and appearing at the emitter electrode of the transistor 14 is applied to the resistor 18, which forms the network resistor of the oscillator, to capacitor 19 and the crystal 20. The voltage developed across the resistor 18 provides the input signal to the differential amplifier formed by the transistors 1 and 2 by means of the coupling between the terminals of the resistor 18 to the base electrodes of the transistors 1 and 2 respectively.

The circuit is designed to oscillate with the crystal branch formed by the capacitor 19 and the crystal 20 in series resonance, when the branch presents an impedance which is much lower than the value $R_1$ of the network resistor 18. The voltage across the resistor 18 which is applied as the input to the differential amplifier is then substantially equal to the output voltage of the second integrator.

With bias currents I flowing through each of the transistors 1 and 2 the circuit loop gain may be expressed in Laplace Transform notation by the following equation.

$$Gain = -qI/2KT\ S^2C_1C_2R_2 \qquad 1$$

Where K is Boltzmanns constant, T is absolute temperature, q is the electronic charge and S is complex frequency.

Equation 1 above shows zero phase shift and a gain falling by 12 dB/octave. The gain at the third overtone of the crystal is therefore 19 dB below that at the fundamental.

Figure 2:
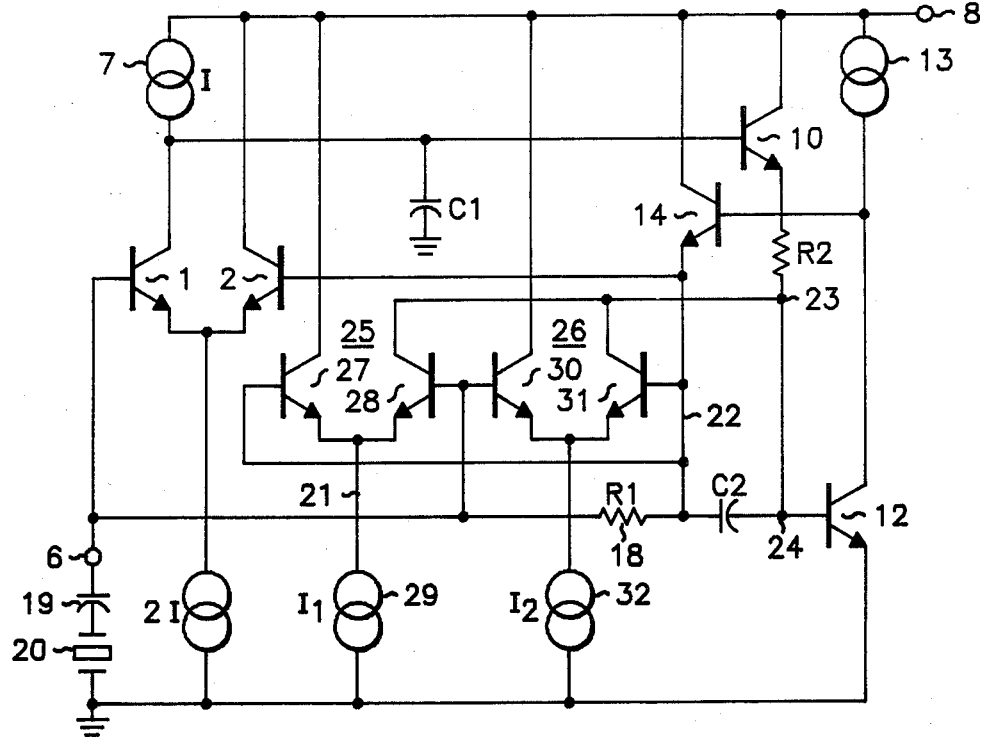
FIG. 2 illustrates the oscillator of FIG. 1 with the addition of frequency adjustment means and FIG. 3 illustrates the oscillator of FIG. 2 with D.C. biasing circuits.

Referring now to FIG. 2 of the drawings there is shown an oscillator circuit which is essentially the same as that shown in FIG. 1 with the addition of frequency adjustment means for adjusting the oscillating frequency of the oscillator. Like parts in FIGS. 1 and 2 bear like reference numerals. To provide adjustment of the oscillating frequency a control circuit 21 is included having an input 22 fed from the output of the second integrator provided by the emitter electrode of the transistor 14 and an output 23 coupled to input 24 of the second integrator provided by the base electrode of the transistor 12.

The control circuit 21 feeds an output signal of adjustable amplitude to input 24 of the second integrator, the oscillating frequency of the oscillator being adjusted in dependence upon the amplitude of the control signal.

In the illustrated embodiment the control circuit is formed by a differential amplifier circuit. Current sources 29 and 32 provide adjustable tail current to provide adjustment of the amplitude of the control signal.

The differential amplifier circuit which forms part of the control circuit is provided by two differential amplifiers 25 and 6. The differential amplifier 25 is formed by NPN transistors 27 and 28 whose emitter electrodes are coupled together and to a current source 29 which supplies a current of value $I_1$. The collector electrode of the transistor 28 is coupled to the output 23 of the control circuit whilst the collector electrode of the transistor 27 is connected to the supply terminal 8.

The base electrode of the transistor 27 which provides an input terminal for the differential amplifier 25 is coupled to the input terminal 22 of the control circuit and to the first terminal of the resistor 18 whilst the base electrode of the transistor 28 which forms a second input to the amplifier 25 is coupled to a second terminal of the resistor 18.

The differential amplifier 26 is formed by NPN transistors 30 and 31 having emitter electrodes which are coupled together and to a current source 32 which supplies a current $I_2$.

The collector electrode of the transistor 31 is coupled to the collector electrode of the transistor 28 and to the output terminal 23 of the control circuit. The collector electrode of the transistor 30 is coupled to the supply terminal 8. The base electrode of the transistor 31 which is an input to the amplifier 26 is coupled to the input terminal 22 of the control circuit and to the first terminal of the resistor 18 whilst the base electrode of the transistor 30 is coupled to the second terminal of the resistor 18.

The differential amplifiers 25 and 26 biased by currents $I_1$ and $I_2$ respectively supplied by current sources 29 and 32, receive as inputs the voltage appearing across the network resistor 18. The a.c. or signal output current fed to the output terminal 23 of the control circuit and hence to the second input 24 of the second integrator will be zero, (assuming that the transistors in the differential amplifiers 25 and 26 are of ideally matched characteristics), if the currents $I_1$ and $I_2$ supplied by the current sources 29 and 32 respectively are equal, and can be varied by varying the values of one or both of the currents $I_1$ and $I_2$.

Neglecting second order effects, the loop gain of the circuit at the series resonance frequency of the crystal circuit is given by $$\text{Loop Gain} = \frac{-q}{KT}\left[\frac{I}{2S^2C_1C_2R_2} + \frac{(I_1 - I_2)}{4SC_2}\right] \qquad 2$$

-continued $$= \frac{-qI}{2KTS^2C_1C_2R_2}\left[1 + \frac{I_1 - I_2}{2I}SC_1R_2\right] \quad 3$$

The control circuit therefore generates a phase shift at frequency W of $$\tan^{-1}\left[WC_1R_2\frac{I_1 - I_2}{2I}\right] \quad 4$$

The phase shift may be leading or lagging passing through zero for equal values of $I_1$ and $I_2$.

As so far described the circuits illustrated in FIGS. 1 and 2 do not show in detail any means for establishing the quiescent operating conditions. It might appear possible to incorporate D.C. biasing by simply adding a resistor between the terminal 6 and a suitable bias voltage. This would generate a negative feed-back loop at zero frequency (where the integrators are inoperative). Due to the action of the integrators however, a 180 degree phase shift would be provided at frequencies at which the loop gain is very high. Any excess phase shift in the circuit could then result in spurious oscillation.

In a preferred embodiment of the present invention this problem is overcome by use of an auxiliary feed-back loop having low gain at oscillator signal freqencies, in order to set the quiescent operating conditions of the amplifier.

Figure 3:
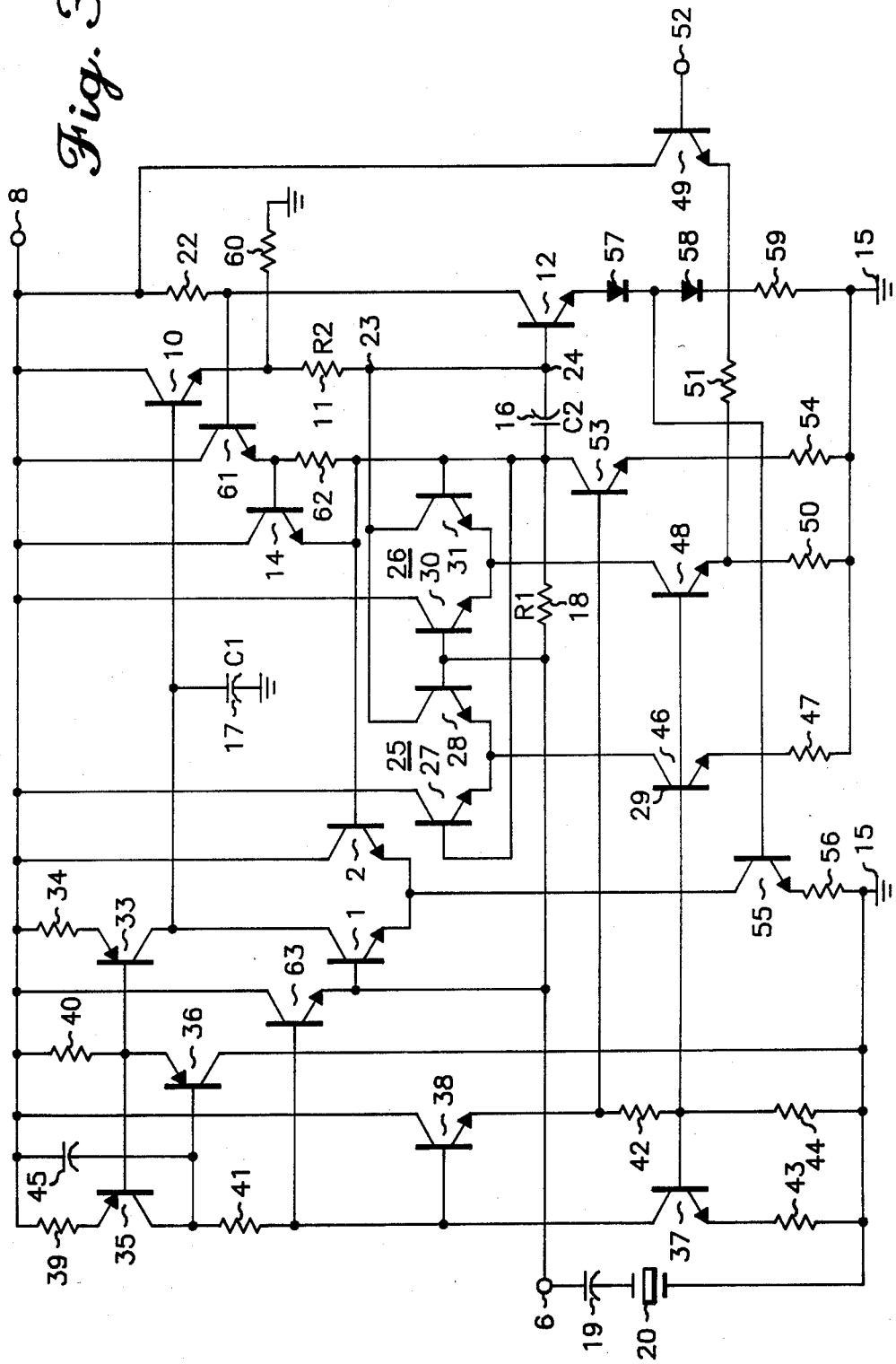

A preferred embodiment of the invention is illustrated in FIG. 3 to which reference will now be made. Like parts in FIG. 3 to those in FIGS. 1 and 2 bear like reference numerals.

The current source 7 which provides the current to the collector of the transistor 1 is formed by a PNP transistor 33 and resistor 34 the collector of the transistor 33 being coupled to the collector electrode of the transistor 1 and the emitter of the transistor 33 being coupled to the supply terminal 8 through the resistor 34. D.C. bias for the transistor 33 is provided by a D.C. bias chain including PNP transistors 35 and 36 and NPN transistors 37 and 38 and resistors 39, 40, 41, 42, 43 and 44.

The base electrodes of the transistors 33 and 35 are coupled together and to the supply terminal 8 through the resistor 40. The transistor 36 has its base electrode coupled to the collector electrode of the transistor 35, its collector electrode connected to the earth terminal 15 and its emitter electrode coupled to the base electrodes of the transistors 33 and 35. The emitter electrode of the transistor 35 is coupled to the supply terminal 8 via the resistor 39.

A capacitor 45 is coupled between the base electrode of the transistor 36 and the supply terminal 8 and is provided to ensure the stability of the current mirror formed by the transistors 33, 35 and 36. The resistor 40 ensures that the transistor 36 is adequately biased to absorb any signal current fed through the collector-base capacitance of the transistor 33.

The collector of the transistor 35 is coupled through the resistor 41 to the collector electrode of the transistor 37 whose emitter electrode is coupled to the earth supply terminal 15 through the resistor 43. The D.C. level at the base of the transistor 37 is set by means of the transistor 38 having its base electrode coupled to the collector electrode of the transistor 37, its collector electrode connected to the supply terminal 8 and its emitter electrode coupled to the base electrode of the transistor 37 through the resistor 42, the further resistor 44 having one terminal connected to the base electrode of the transistor 37 and its other terminal connected to the earth supply terminal 15.

The bias chain also provides D.C. bias to the current source 29 formed by a NPN transistor 46 and resistor 47. The collector electrode of the transistor 46 provides the tail current for the differential amplifier 25 and is connected to the emitter electrodes of the transistors 27 and 28 which comprise the differential amplifier 25. The emitter electrode of the transistor 46 is coupled to the earth terminal 15 through the resistor 47 whilst the base electrode is connected to the base electrode of the transistor 37.

The current source 32 which is an adjustable current source and which provides the tail current for the differential amplifier 26 is similarly biased by means of NPN transistors 48 and 49. The transistor 48 has its base electrode connected to the base electrodes of the transistors 37 and 46 and its collector electrode carries the tail current of the differential amplifier 26 and is connected to the emitter electrodes of the transistors 30 and 31 which comprise the differential amplifier 26. The emitter electrode of the transistor 48 is coupled to the earth terminal 15 through a resistor 50.

The transistor 49 has its emitter electrode coupled to that of the transistor 48 through a resistor 51 and its collector electrode connected to the supply terminal 8. The base electrode of the transistor 49 is connected to a terminal 52 to which in operation a control potential may be applied. The amplitude of the control potential determines the value of the tail current $I_2$ for the differential amplifier 26 and hence the relative magnitude of the currents $I_1$ and $I_2$ by means of which the frequency of oscillation of the oscillator may be controlled.

The emitter electrode of the transistor 14 is supplied by means of a NPN transistor 53 having its base electrode connected to the emitter electrode of the transistor 38, its emitter electrode coupled to the earth terminal 15 through a resistor 54 and its collector electrode connected to the emitter electrode of the transistor 14.

The transistors 1 and 2 which comprise the amplifier of the oscillator feed-back loop are not biased by means of a conventional bias chain but by means of an auxiliary feed-back loop having low gain at oscillator signal frequencies. The current source 3 which supplies the tail current for the transistors 1 and 2 of the differential amplifier is formed by a NPN transistor 55 having its collector electrode connected to the emitter electrodes of the transistors 1 and 2 and its emitter electrode coupled to the earth terminal 15 through a resistor 56. The transistor 55 is biased by means of the current flowing through the transistor 12 whose emitter is coupled to the earth terminal 15 through two series connected diodes 57 and 58 and a resistor 59. The base electrode of the transistor 55 is connected to the node between the diodes 57 and 58.

The current source formed by the transistor 55 and the resistor 56 and which supplies the emitter electrodes of the transistors 1 and 2 is biased with the voltage developed across the series combination of the diode 58 and the resistor 59 in the emitter circuit of the transistor 12. The current supplied to the emitters of the transistors 1 and 2 is thus controlled by the current flowing in the transistor 12 and this connection establishes the auxiliary negative feed-back loop which acts to match the quiescent currents flowing in the collector of the transistor 1 to that supplied by the current source formed by the transistor 33 and the resistor 34, defining in consequence the quiescent current flow in the transistor 12, the quiescent collector voltage of the transistor 12 and the quiescent voltages at the emitter electrode of the transistor 14 and the base electrodes of the transistors 1, 2, 27, 28, 30, and 31.

The quiescent voltage at the base electrode of the transistor 12, connected to the collector electrodes of the transistors 28 and 31 is determined by the voltage drop of the base emitter junction of the transistor 12 plus those of the diodes 57 and 58 and a (in practice) small voltage developed across the resistor 59.

The quiescent voltage at the collector of the transistor 1 is raised above that at the base electrode of the transistor 12 by the base emitter voltage of the transistor 10 and the voltage drop due to the collector currents of the transistors 28 and 31 flowing through the resistor 11. The transistor 10 is provided with additional emitter bias current by means of the resistor 60 coupled between the emitter electrode of the transistor 10 and the earth terminal 15.

In order to increase the quiescent voltage difference between the collector of the transistor 12 and the bases of the transistors 1 and 2, an additional NPN transistor 61 is added. The transistor 61 has its base electrode connected to the collector electrode of the transistor 12 whilst its emitter electrode is connected to the base electrode of the transistor 14 and is coupled to the base electrode of the transistor 2 by means of a resistor 62. The collector electrode of the transistor 61 is connected to the supply terminal 8.

The base electrode of the transistor 1 is connected to the emitter electrode of an additional NPN transistor 63 whose collector electrode is connected to the supply terminal 8 and whose base electrode is connected to the collector electrode of the transistor 37 and the base electrode of the transistor 38.

The transistor 63 is provided in order to inhibit a "latch-out" condition when power is applied to the oscillator circuit. Such a condition could occur if the transistor 55 forming part of the current source 3 became saturated. The base electrode of transistor 63 is biased at a voltage which is defined by the transistors 37 and 38 and the resistors 42, 43 and 44, which is sufficient to protect the transistor 55 from saturation while being sufficiently low to maintain the transistor 63 non-conducting under normal operating conditions.

Assuming as for the embodiment of FIGS. 1 and 2 that the crystal branch formed by the capacitor 19 and the crystal 20 is of zero impedance at series resonance, then the loop gain of the circuit at that frequency may be expressed as;

$$\text{Loop Gain} = \frac{\frac{-qI_{33}R_o}{nKT}\left[1 - SC_1R_2\left(1 - \frac{I_{48}}{I_{46}}\right)\right]}{1 + A + B + C} \qquad 5$$

$$\text{Where } A = S\left[C_oR_o + \frac{C_1R_e}{n}\right]$$

$$\text{Where } B = S^2 \frac{2C_1}{n}[C_2R_2(R_o + R_e)] + C_oR_oR_e$$

-continued $$\text{Where } C = S^3 \frac{2C_1}{n} C_2C_oR_oR_2R_e$$

Where $I_{33}$, $I_{46}$ and $I_{48}$ are the currents supplied respectively by the transistors 33, 46 and 48, n is the ratio of the current supplied by the transistor 55 to that flowing in the transistor 12, $R_e$ is the inverse of the mutual conductance of the combination of the transistor 12, diodes 57 and 58 and the resistor 59.

If the transistor 12 passes a quiescent current $I_{12}$ and the resistor 59 is of value $R_{59}$ then;

$$Re = \frac{3 KT}{qI_{12}} + R_{59} \qquad 6$$

$C_o$ is the total stray capacitance at the node between the collector of the transistor 12 and the resistor 22.

The values C1 and C2 used for the capacitors 17 and 16 respectively must include the appropriate stray capacitances. The collector base capacitance of the transistor 12 is included in the value of C2 as well as in that of $C_o$.

The value R1 of the resistor 18 is calculated according to the characteristics of the crystal 20, the range of frequency adjustment required and the phase shift range chosen for tuning.

The invention is particularly suitable for incorporating in an integrated circuit and has the advantage that the crystal branch formed by the capacitor 19 and the crystal 20 which would of course be external to the integrated circuit needs only to be connected to a single terminal of the circuit. In addition only the single capacitor 19 need be placed in series with the crystal 20. The oscillator has improved temperature sensitivity and may be operated from a single, typically 5 Volt, supply.

We claim:

1. A crystal controllable oscillator circuit comprising an amplifier having an input for coupling a crystal resonator thereto and having an output, an oscillation sustaining feed-back loop coupled between the output and the input of the amplifier, the loop including a first integrator and a second integrator fed from the first integrator whereby overtone oscillations are inhibited.

2. A crystal controllable oscillator as claimed in claim 1 wherein the amplifier comprises a differential amplifier having an output and first and second inputs, the feed-back loop being coupled to the output of the differential amplifier, means being provided for coupling the output of the second integrator to the first and second inputs of the differential amplifier.

3. An oscillator circuit as claimed in claim 2 wherein the output of the second integrator is coupled to a first of two terminals of a resistive means the said two terminals being coupled to respective ones of the first and second inputs of the differential amplifier.

4. An osciiator circuit as claimed in claim 1 and including means for adjusting the frequency of oscillation.

5. An oscillator circuit as claimed in claim 4 wherein the means for adjusting the frequency of oscillation comprises a control circuit having an input coupled to the output of the second of the two integrators and an output coupled to a control input of the second integrator whereby the loop phase shift of the feed-back loop is controllable in dependence upon the amplitude of a control signal applied to the control input by the control circuit.

6. An oscillator circuit as claimed in claim 5 wherein the control circuit is operative to provide a control signal whose amplitude range provides loop phase shifts of opposite sense about zero phase shift.

7. An oscillator circuit as claimed in claim 5 wherein the control circuit comprises differential amplifier means having an input fed from the output of the second integrator and an output for providing the control signal, and tail current adjustment means for enabling a tail current of the differential amplifier means to be changed to effect adjustment of the amplitude of the control signal.

8. An oscillator circuit as claimed in claim 7 wherein the differential amplifier means includes two differential amplifiers having outputs coupled together to provide the output of the control circuit and each having an input coupled to the output of the second integrator, the tail current adjustment means being arranged to provide relative adjustment of the tail currents of the two differential amplifiers.

9. An oscillator circuit as claimed in claim 1 wherein the amplifier is coupled to an auxiliary negative feed-back loop having relatively low gain at oscillator signal frequencies for providing quiescent D.C. bias for the amplifier.

10. An oscillator circuit as claimed in claim 1 and provided in integrated circuit form.

11. A crystal controllable oscillator circuit comprising a differential amplifier having an output and first and second inputs; a crystal circuit coupled between the first input and a supply terminal; an oscillation sustaining feed-back loop coupled to the output of the differential amplifier, the loop including a first integrator and a second integrator fed from the first integrator, means coupling an output of the second integrator to the first and second inputs of the differential amplifier; a frequency control circuit having an input coupled to the output of the second integrator and an output coupled to feed an adjustable amplitude frequency control signal to a control input of the second integrator and an auxiliary negative feed-back loop having relatively low gain at oscillator signal frequencies coupled to the differential amplifier for establishing quiescent D. C. biasing for the amplifier whereby to provide an adjustable frequency crystal controllable oscillator in which oscillations at crystal overtones are inhibited.

* * * * *